(12) United States Patent
Saito et al.

(10) Patent No.: US 11,232,991 B2
(45) Date of Patent: Jan. 25, 2022

(54) SEMICONDUCTOR APPARATUS

(71) Applicant: Mitsubishi Electric Corporation, Tokyo (JP)

(72) Inventors: Shoji Saito, Tokyo (JP); Seiichiro Inokuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,123

(22) PCT Filed: Feb. 23, 2017

(86) PCT No.: PCT/JP2017/006911
§ 371 (c)(1),
(2) Date: Jun. 24, 2019

(87) PCT Pub. No.: WO2018/154687
PCT Pub. Date: Aug. 30, 2018

(65) Prior Publication Data
US 2019/0371688 A1 Dec. 5, 2019

(51) Int. Cl.
*H01L 23/13* (2006.01)
*H01L 23/14* (2006.01)
(Continued)

(52) U.S. Cl.
CPC ............ *H01L 23/13* (2013.01); *H01L 23/142* (2013.01); *H01L 23/3677* (2013.01);
(Continued)

(58) Field of Classification Search
CPC combination set(s) only.
See application file for complete search history.

(56) References Cited

U.S. PATENT DOCUMENTS 7,122,243 B2 * 10/2006 Osanai ................... H01L 23/13
428/210
7,901,509 B2 * 3/2011 Mariner ............ H01L 21/68757
118/715
(Continued)

FOREIGN PATENT DOCUMENTS

DE   10 2011 089 886 A1   2/2013
EP      3 252 810 A1     12/2017
(Continued)

OTHER PUBLICATIONS

International Search Report; Written Opinion; and Notification of Transmittal of the International Search Report and the Written Opinion of the International Searching Authority, or the Declaration issued in PCT/JP2017/006911; dated Apr. 18, 2017.
(Continued)

*Primary Examiner* — Telly D Green
(74) *Attorney, Agent, or Firm* — Studebaker & Brackett PC

(57) ABSTRACT

A semiconductor apparatus includes a metal base plate, an upper surface ceramic substrate provided on an upper surface of the metal base plate, a semiconductor device provided on the upper surface ceramic substrate, and a substrate that is provided in the metal base plate and includes an embedded ceramic substrate, an upper surface metal pattern provided on an upper surface of the embedded ceramic substrate, and a lower surface metal pattern provided on a lower surface of the embedded ceramic substrate, wherein a thermal conductivity of the upper surface metal pattern and a thermal conductivity of the lower surface metal pattern are larger than a thermal conductivity of the metal base plate.

20 Claims, 7 Drawing Sheets

(51) Int. Cl.
  *H01L 23/367* (2006.01)
  *H01L 23/498* (2006.01)
  *H01L 25/07* (2006.01)
  *H01L 25/18* (2006.01)
  *H04L 25/18* (2006.01)

(52) U.S. Cl.
  CPC ...... *H01L 23/49838* (2013.01); *H01L 25/072* (2013.01); *H01L 25/18* (2013.01)

(56) References Cited

U.S. PATENT DOCUMENTS

| | | | | |
|---|---|---|---|---|
| 9,196,562 | B2* | 11/2015 | Siepe | H01L 24/49 |
| RE46,136 | E* | 9/2016 | Mariner | C23C 16/4586 |
| 9,761,567 | B2* | 9/2017 | Hori | H01L 25/18 |
| 9,818,687 | B2* | 11/2017 | Kanai | H01L 23/49811 |
| 10,014,237 | B2* | 7/2018 | Kooriyama | H01L 21/4857 |
| 10,104,783 | B2* | 10/2018 | Chiwata | H01L 23/12 |
| 10,319,664 | B2* | 6/2019 | Terasaki | C04B 35/645 |
| 2005/0084704 | A1* | 4/2005 | Osanai | H01L 23/13 |
| | | | | 428/621 |
| 2008/0066676 | A1* | 3/2008 | Mariner | H01L 21/67103 |
| | | | | 118/715 |
| 2013/0285234 | A1 | 10/2013 | Uhlemann et al. | |
| 2015/0366048 | A1* | 12/2015 | Nagase | H01L 23/3736 |
| | | | | 174/252 |
| 2017/0352607 | A1* | 12/2017 | Kooriyama | H01L 21/4857 |
| 2018/0005914 | A1* | 1/2018 | Ogawa | H01L 23/367 |
| 2018/0061666 | A1* | 3/2018 | Roth | C04B 41/5127 |
| 2018/0190568 | A1* | 7/2018 | Naba | H01L 23/49811 |

FOREIGN PATENT DOCUMENTS

| | | |
|---|---|---|
| JP | 2002-076213 A | 3/2002 |
| JP | 2011-077389 A | 4/2011 |

OTHER PUBLICATIONS

An Office Action mailed by the German Patent Office dated Oct. 20, 2020, which corresponds to German Patent Application No. 11 2017 007 117.8 and is related to U.S. Appl. No. 16/473,123 ; with English language translation.

* cited by examiner

SEMICONDUCTOR APPARATUS

FIELD

The present invention relates to, for example, a semiconductor apparatus used for control of large power.

BACKGROUND

Patent Literature 1 discloses a metal-ceramic bonded substrate in which one surface of a metal plate is bonded to one surface of a ceramic substrate and one surface of a metal base plate is bonded to the other surface of the ceramic substrate. In this metal-ceramic bonded substrate, at least one or more reinforcements are bonded to the metal base plate. The material of the reinforcement is ceramics. A part of the reinforcement is exposed from the metal base plate. The above-described ceramic substrate is provided on the metal base plate. A metal plate which is a circuit pattern is formed on the ceramic substrate. A technique disclosed in Patent Literature 1 aims at both of control of warpage and insurance of heat dissipation by precisely controlling the arrangement and position of the reinforcement.

PRIOR ART

Patent Literature

Patent Literature 1: JP 2011-77389A

SUMMARY

Technical Problem

There is a risk that the metal base plate may be warped during operation of a semiconductor device due to the difference in thermal expansion coefficient between the metal base plate and the ceramic substrate provided on the metal base plate. Therefore, in the technique disclosed in Patent Literature 1, a reinforcement formed of ceramics as a material is inserted in the metal base plate.

The thermal conductivity of the reinforcement formed of ceramics as the material is smaller than the thermal conductivity of the metal base plate. Therefore, when the metal-ceramic bonded substrate disclosed in Patent Literature 1 is used, deterioration of thermal resistance is supposed. The deterioration of thermal resistance causes necessity of paying attention to the maximum junction temperature of the semiconductor device which determines the operating temperature of an apparatus, which causes a risk that the performance of the semiconductor device cannot be fully practically used. That is, since the thermal resistance is high, there is a case where the energization amount of the semiconductor device must be reduced. In addition, since the warpage and warpage variation of the metal base plate become greater in a module having a larger size used with a large current, the reinforcement must be thickened in order to suppress the warpage of the metal base plate, and when the reinforcement is thickened, the thermal resistance further deteriorates.

Some examples described herein may provide a semiconductor apparatus capable of enhancing heat dissipation while suppressing warpage of a metal base plate.

Means for Solving the Problems

In some examples, a semiconductor apparatus includes a metal base plate, an upper surface ceramic substrate provided on an upper surface of the metal base plate, a semiconductor device provided on the upper surface ceramic substrate, and a substrate that is provided in the metal base plate and includes an embedded ceramic substrate, an upper surface metal pattern provided on an upper surface of the embedded ceramic substrate, and a lower surface metal pattern provided on a lower surface of the embedded ceramic substrate, wherein a thermal conductivity of the upper surface metal pattern and a thermal conductivity of the lower surface metal pattern are larger than a thermal conductivity of the metal base plate.

Other features will be disclosed below.

Advantageous Effect of Invention

In some examples, since an upper surface metal pattern and a lower surface metal pattern which are higher in thermal conductivity than a metal base plate are provided on an upper surface and a lower surface of an embedded ceramic substrate embedded in the metal base plate, heat dissipation can be enhanced while suppressing warpage of the metal base plate.

BRIEF DESCRIPTION OF THE DRAWINGS

FIG. 14 is plan view of the connection metal and the like.

DESCRIPTION OF EMBODIMENTS

A semiconductor apparatus according to an embodiment will be described with reference to the drawings. The same or corresponding components are represented by the same reference signs, and duplicative description thereon may be omitted.

First Embodiment

Figure 1:
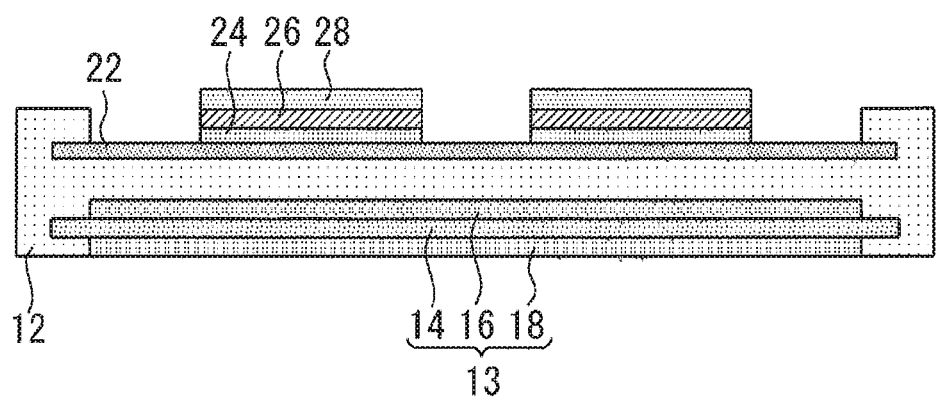
FIG. 1 is a cross-sectional view of a semiconductor apparatus according to a first embodiment.

FIG. 1 is a cross-sectional view of a semiconductor apparatus 10 according to a first embodiment. The semiconductor apparatus 10 includes a metal base plate 12. The metal base plate 12 is formed of, for example, aluminum or aluminum alloy. A substrate 13 is provided in the metal base plate 12. The substrate 13 has an embedded ceramic substrate 14, an upper surface metal pattern 16 provided on an upper surface of the embedded ceramic substrate 14, and a lower surface metal pattern 18 provided on a lower surface of the embedded ceramic substrate 14. The embedded ceramic substrate 14 is a plate formed of ceramics as a material. It is preferable that the embedded ceramic substrate 14 is formed of AlN or $Si_3N_4$. Since these materials are high-strength materials, it is possible to enhance robustness against warpage by forming the embedded ceramic substrate 14 of AlN or $Si_3N_4$.

The upper surface metal pattern 16 and the lower surface metal pattern 18 are, for example, copper patterns. It is preferable that the upper surface metal pattern 16 and the lower surface metal pattern 18 are subjected to a surface treatment for preventing oxidation. Furthermore, the upper surface metal pattern 16 and the lower surface metal pattern 18 are bonded to the embedded ceramic substrate 14, for example, with brazing filler metal.

The upper surface and a side surface of the substrate 13 are covered by the metal base plate 12. Therefore, an end portion of the embedded ceramic substrate 14 is covered by the metal base plate 12. A lower surface of the lower surface metal pattern 18 is not covered by the metal base plate 12, and is exposed to an outside.

Selection of the materials of the metal base plate 12, the upper surface metal pattern 16, and the lower surface metal pattern 18 is performed so that the thermal conductivity of the upper surface metal pattern 16 and the thermal conductivity of the lower surface metal pattern 18 are larger than the thermal conductivity of the metal base plate 12. For example, when the metal base plate 12 is formed of aluminum, the upper surface metal pattern 16 and the lower surface metal pattern 18 are formed of copper or the like which is higher in thermal conductivity than aluminum. Any material satisfying the above relationship in thermal conductivity can be used.

An upper surface ceramic substrate 22 is provided on the upper surface of the metal base plate 12. The upper surface ceramic substrate 22 is a plate formed of ceramics as a material. A metal film 24 is formed on the upper surface ceramic substrate 22. The metal film 24 is a metal pattern formed on the upper surface ceramic substrate 22. A semiconductor device 28 is fixed to the metal film 24 by solder 26. In place of the solder 26, a lead-free conductive adhesive agent may be used. The semiconductor device 28 is, for example, an insulated gate bipolar transistor (IGBT) or a freewheeling diode. The semiconductor device 28 is provided on the upper surface ceramic substrate 22 as described above.

The metal base plate 12, the substrate 13, and the upper surface ceramic substrate 22 can be formed, for example, by casting. Specifically, the upper surface ceramic substrate 22 and the substrate 13 are set in a mold, and molten metal is poured into the mold. Thereafter, the mold is opened, whereby the metal base plate 12 to which the upper surface ceramic substrate 22 and the substrate 13 are fixed can be obtained. If necessary, a cooler is fixed to the lower surface metal pattern 18. When the cooler is fixed, it is desirable that the flatness of the lower surface metal pattern 18 be set to 0 to 200 μm.

Since the semiconductor apparatus 10 according to the first embodiment includes the embedded ceramic substrate 14 embedded in the metal base plate 12, the warpage of the metal base plate 12 can be suppressed. Therefore, variation in warpage is also suppressed. Furthermore, the relationship between the thermal conductivity $\alpha_M$ of the upper surface metal pattern 16 and the lower surface metal pattern 18 and the thermal conductivity $\alpha_B$ of the metal base plate 12 is set to $\alpha_M > \alpha_B$. Therefore, it is possible to enhance the heat dissipation of the semiconductor apparatus by providing the upper surface metal pattern 16 and the lower surface metal pattern 18.

Furthermore, when the end portion of the embedded ceramic substrate 14 is exposed from the metal base plate 12, the embedded ceramic substrate 14 may crack due to an external impact. On the other hand, in the semiconductor apparatus 10 according to the first embodiment, since the end portion of the embedded ceramic substrate 14 is covered by the metal base plate 12, the embedded ceramic substrate 14 can be avoided from cracking.

The semiconductor apparatus 10 according to the first embodiment can be variously modified without losing its characteristics. For example, the number of the semiconductor devices 28 is not particularly limited. When a three-phase AC inverter circuit is configured in the semiconductor apparatus 10, six IGBTs and six freewheeling diodes are provided. The above modification can be applied to a semiconductor apparatus according to the following embodiment. Note that the semiconductor apparatus according to the following embodiment has many common points with the semiconductor apparatus 10 according to the first embodiment, and thus the difference from the first embodiment will be mainly described.

Second Embodiment

Figure 2:
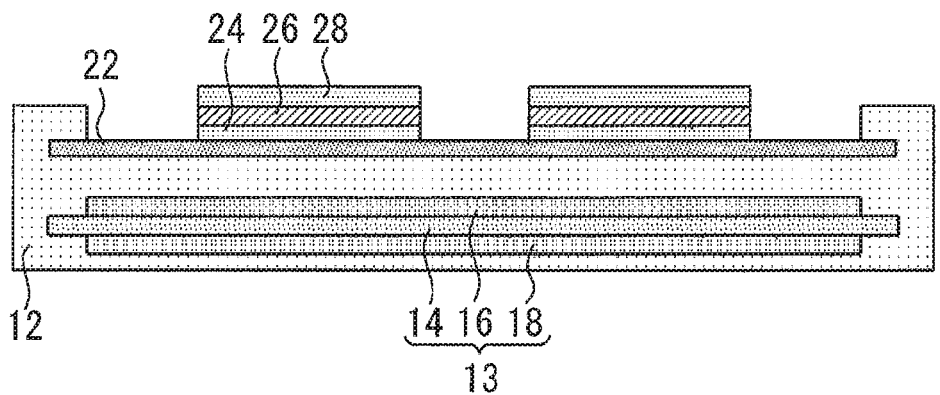
FIG. 2 is a cross-sectional view of a semiconductor apparatus according to a second embodiment.

FIG. 2 is a cross-sectional view of a semiconductor apparatus 30 according to a second embodiment. The lower surface of the lower surface metal pattern 18 is covered by the metal base plate 12. That is, the substrate 13 is embedded in the metal base plate 12. Therefore, the lower surface of the metal base plate 12 is exposed to an outside. When the lower surface metal pattern 18 is exposed to the outside, there is a risk that the lower surface metal pattern 18 may be oxidized and corroded. However, since the lower surface metal pattern 18 of the semiconductor apparatus 30 is covered by the metal base plate 12, oxidation and corrosion of the lower surface metal pattern 18 can be prevented. Therefore, it is expected that the lifetime of the semiconductor apparatus 30 is extended.

Figure 3:
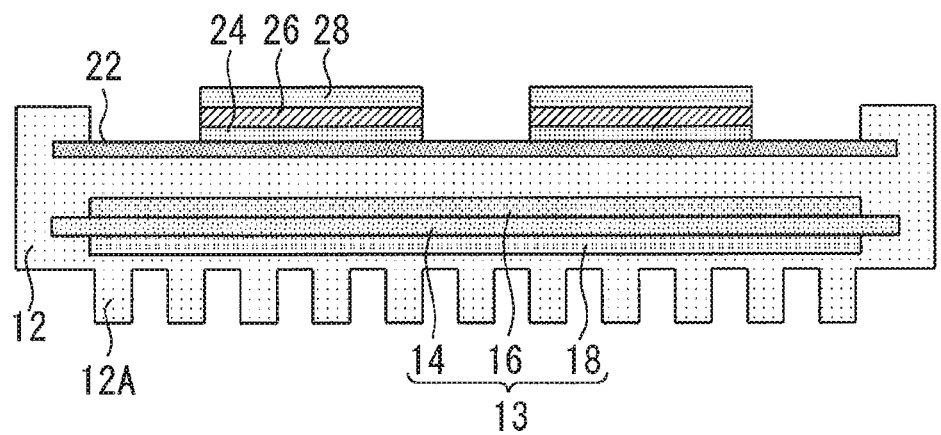
FIG. 3 is a cross-sectional view of a semiconductor apparatus according to a modification.

FIG. 3 is a cross-sectional view of a semiconductor apparatus according to a modification. Pin fins 12A are provided on the lower surface of the metal base plate 12. By providing the pin fins 12A on a part of the metal base plate 12, it is possible to directly cool the metal base plate 12. In addition, thermal grease used for thermal connection between the metal base plate 12 and the cooler can be omitted, so that improvement in thermal resistance can be expected.

Third Embodiment

Figure 4:
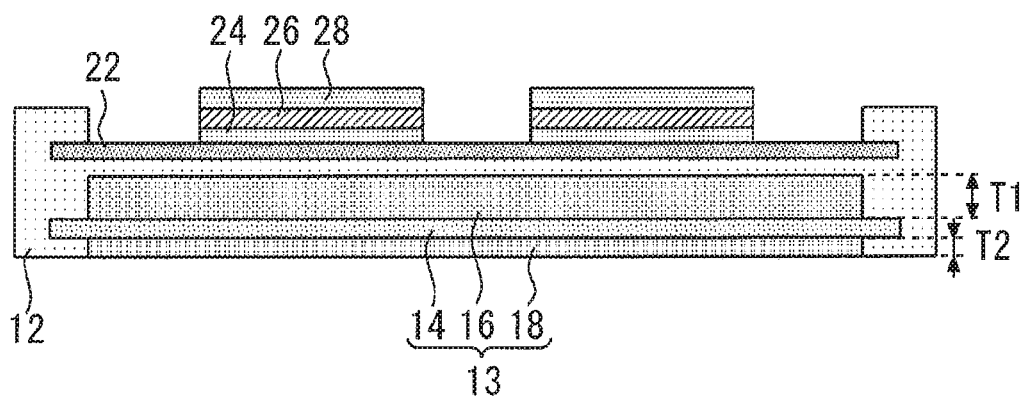
FIG. 4 is a cross-sectional view of a semiconductor apparatus according to a third embodiment.

FIG. 4 is a cross-sectional view of a semiconductor apparatus 50 according to a third embodiment. The thicknesses of the upper surface metal pattern 16 and the lower surface metal pattern 18 are different from each other. More specifically, the thickness T1 of the upper surface metal pattern 16 is larger than the thickness T2 of the lower surface metal pattern 18. T1 is set to, for example, 1.0 mm, and T2 is set to, for example, 0.3 mm. As the upper surface metal pattern 16 is made thicker, more heat generated from the semiconductor device 28 can be accumulated in the upper surface metal pattern 16 and thermally diffused. Therefore, as the upper surface metal pattern 16 is made thicker, more improvement in transient thermal resistance can be expected. In the third embodiment, since the upper surface metal pattern 16 is formed to be thicker than the lower surface metal pattern 18, excellent heat dissipation can be provided.

By freely controlling the thicknesses of the upper surface metal pattern 16 and the lower surface metal pattern 18 so that the thicknesses have different values, the warpage amount of the entire metal base plate 12 can be controlled. Therefore, the upper surface metal pattern 16 is not necessarily made thicker than the lower surface metal pattern 18. In order to suppress the warpage of the metal base plate 12, the lower surface metal pattern 18 may be made thicker than the upper surface metal pattern 16.

Fourth Embodiment

Figure 5:
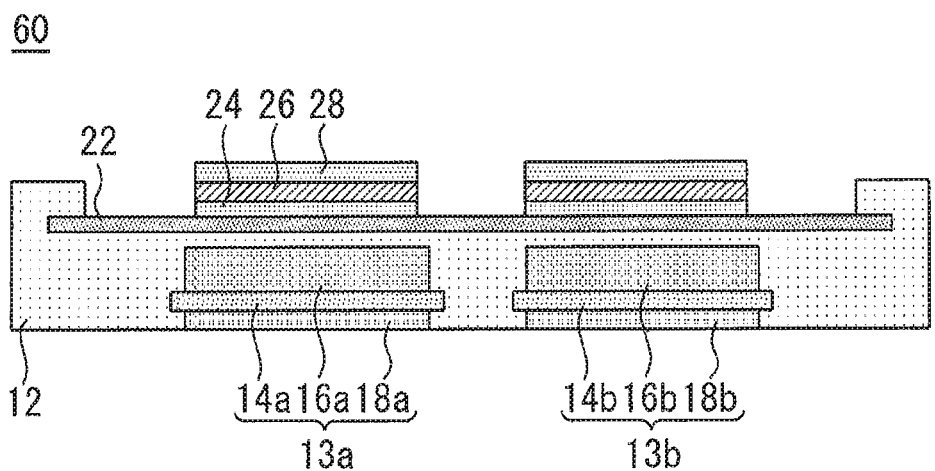
FIG. 5 is a cross-sectional view of a semiconductor apparatus according to a fourth embodiment.

FIG. 5 is a cross-sectional view of a semiconductor apparatus 60 according to a fourth embodiment. A substrate 13a includes an embedded ceramic substrate 14a, an upper surface metal pattern 16a formed on an upper surface of the embedded ceramic substrate 14a, and a lower surface metal pattern 18a formed on a lower surface of the embedded ceramic substrate 14a. A substrate 13b includes an embedded ceramic substrate 14b, an upper surface metal pattern 16b formed on an upper surface of the embedded ceramic substrate 14b, and a lower surface metal pattern 18b formed on a lower surface of the embedded ceramic substrate 14b.

The substrate 13a is provided immediately under the left-side semiconductor device 28 and the substrate 13b is provided immediately under the right-side semiconductor device 28. That is, a plurality of semiconductor devices 28 are provided, and one substrate is provided immediately under the semiconductor device 28. For example, in a case of a six-phase-containing module, six substrates are prepared, and each substrate is arranged immediately under the semiconductor device.

A substrate having an embedded ceramic substrate is a stress relaxation layer. By providing the plurality of substrates 13a and 13b, it is possible to reduce the stress applied to the substrate per one substrate. Therefore, it is possible to reduce the warpage amount of the entire metal base plate 12. The reduction of the warpage amount of the metal base plate 12 enables increase of the size of the semiconductor apparatus 60. The semiconductor apparatus 60 is not limited to the above-described configuration as long as plural substrates are provided. The number of substrates to be provided is not particularly limited.

Fifth Embodiment

Figure 6:
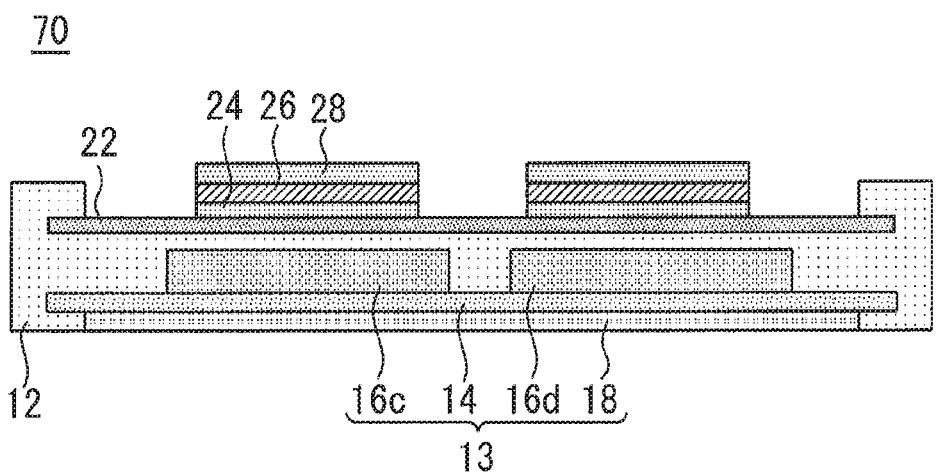
FIG. 6 is a cross-sectional view of a semiconductor apparatus according to a fifth embodiment.

FIG. 6 is a cross-sectional view of a semiconductor apparatus 70 according to a fifth embodiment. Upper surface metal patterns 16c and 16d are formed on the upper surface of one embedded ceramic substrate 14. The upper surface metal pattern 16c and the upper surface metal pattern 16d are separated from each other. The upper surface metal pattern 16c is positioned immediately under the left-side semiconductor device 28 and the upper surface metal pattern 16d is positioned immediately under the right-side semiconductor device 28. The widths of the upper surface metal patterns 16c and 16d are larger than the width of the semiconductor device 28.

Figure 7:
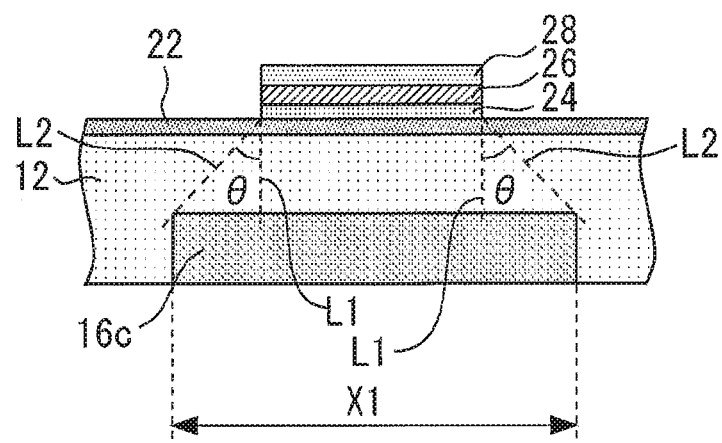
FIG. 7 is a partially enlarged view of FIG. 6.

FIG. 7 is a partially enlarged view of FIG. 6. Vertical lines L1 passing through an outer edge of a lower surface of the metal film 24 and lines L2 connecting the outer edge of the lower surface of the metal film 24 and an outer edge of an upper surface of the upper surface metal pattern 16c are shown. An intersection angle θ between the vertical line L1 and the line L2 is set to 45° or more. The relationship between the vertical line L1 and the line L2 as described above is established at all points on the outer edge of the upper surface of the upper surface metal pattern 16c. Therefore, in plan view, the outer edge of the upper surface metal pattern 16e has an enlarged similar figure of the outer edge of the metal film 24. It is preferable that all the upper surface metal patterns satisfy this 45°-relationship.

Heat is generated in the semiconductor device 28, and the heat reaches the metal film 24, and mainly thermally diffuses to the metal base plate 12 between the right-side line L2 and the left-side line L2. Therefore, in order to sufficiently dissipate heat, it is important to provide the upper surface metal pattern to a portion sandwiched between the right-side line L2 and the left-side line L2. In other words, even when the upper surface metal pattern is provided to a portion which is not sandwiched between the right-side line L2 and the left-side line L2, an essential improvement in the heat dissipation cannot be expected.

Therefore, in the fifth embodiment, as described above, the upper surface metal patterns 16c and 16d are provided at the portion sandwiched between the right-side line L2 and the left-side line L2. In other words, the upper surface metal patterns 16c and 16d are provided so that the intersection angle θ between the vertical line L1 and the line L2 is equal to 45° or more. Providing the upper surface metal patterns 16c and 16d so that the intersection angle is equal to 45° corresponds to providing the minimum necessary upper surface metal pattern. Increasing the intersection angle θ corresponds to increasing the width of the upper surface metal pattern. Minimization of the areas of the upper surface metal patterns 16c and 16d contributes to reduction of the cost. The warpage amount of the metal base plate 12 can also be controlled according to the areas of the upper surface metal patterns 16c and 16d.

The number of the semiconductor devices 28 is not limited to two. In a case where plural semiconductor devices 28 are provided, it is possible to minimize the areas of all the upper surface metal patterns by forming plural upper surface metal patterns in the form of islands so as to satisfy the above-described relationship between the vertical line L1 and the line L2.

Sixth Embodiment

Figure 8:
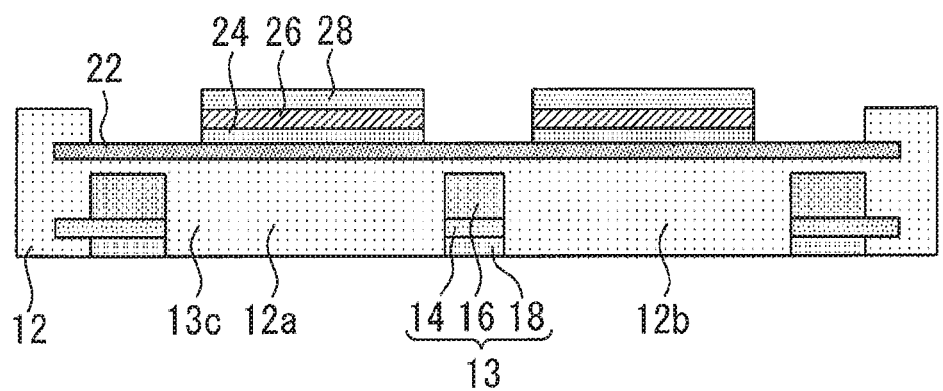
FIG. 8 is a cross-sectional view of a semiconductor apparatus according to a sixth embodiment.
Figure 9:
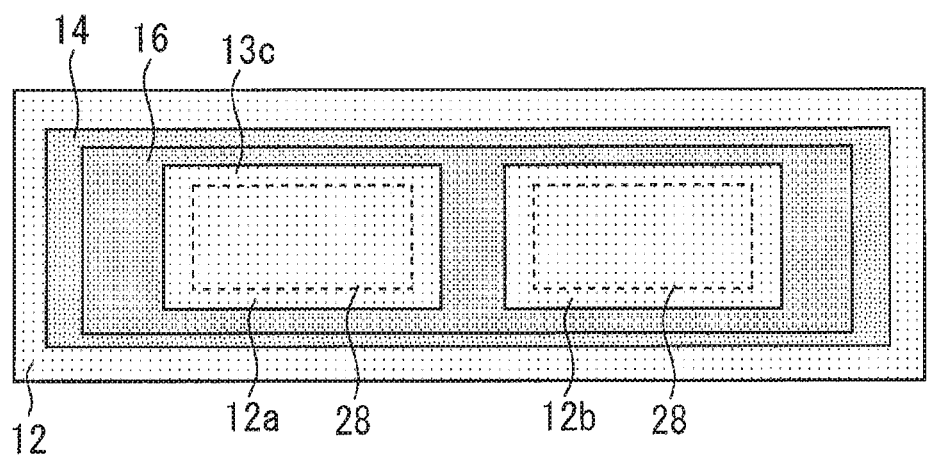
FIG. 9 is a plan view of the substrate through-holes and the like in FIG. 8.

FIG. 8 is a cross-sectional view of a semiconductor apparatus 80 according to a sixth embodiment. The substrate 13 has a substrate through-hole 13c immediately under the semiconductor device 28. The substrate through-hole 13c is a through-hole that penetrates through the upper surface metal pattern 16, the embedded ceramic substrate 14, and the lower surface metal pattern 18. Therefore, none of the embedded ceramic substrate 14, the upper surface metal pattern 16, and the lower surface metal pattern 18 exist at the portion where the substrate through-hole 13c exists. The substrate through-hole 13c is filled with a part 12a of the metal base plate 12. FIG. 9 is a plan view of the substrate through-holes 13c and the like in FIG. 8. The shapes of the semiconductor devices 28 are indicated by broken lines. The outer edges of the substrate through-holes 13c have enlarged similar figures of the outer edges of the semiconductor devices 28.

Figure 10:
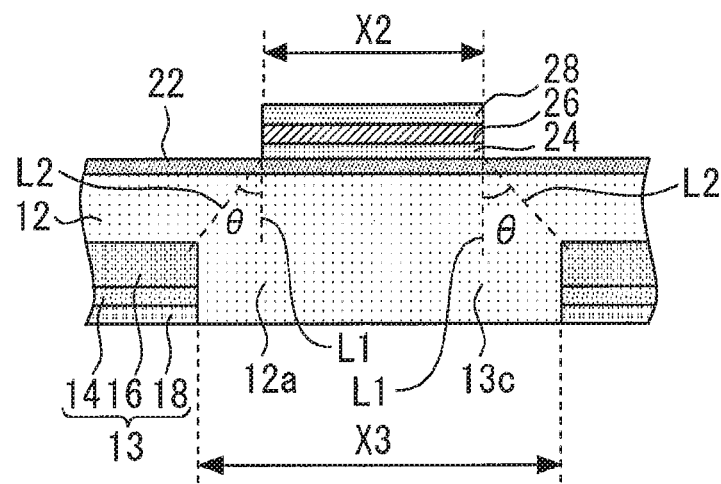
FIG. 10 is a partially enlarged view of FIG. 8.

FIG. 10 is a partially enlarged view of FIG. 8. Vertical lines L1 passing through the outer edge of the lower surface of the metal film 24 and lines L2 connecting the outer edge of the lower surface of the metal film 24 and an outer edge of an upper surface of the substrate through-hole 13c are shown. It is preferable that the intersection angle between the vertical line L1 and the line L2 is set to 45° or more. Heat of the semiconductor device 28 diffuses mainly into an area sandwiched between the right-side line L2 and the left-side line L2. Therefore, it is preferable to avoid the embedded ceramic substrate 14 having thermal conductivity lower than that of the metal base plate 12 from being provided in this heat dissipation path.

In the sixth embodiment, the embedded ceramic substrate 14 is removed from the heat dissipation path when the heat of the semiconductor device 28 reaches the metal base plate 12 and thermally diffuses therefrom at the above-mentioned angle of 45°, which makes it possible to enhance the heat dissipation of the semiconductor apparatus 80. Note that it is possible to obtain a certain degree of heat dissipation improvement effect even when the substrate through-hole 13c is provided only immediately under the semiconductor device 28 and the substrate through-hole 13c is filled with the metal base plate 12. In this case, the planar shape of the semiconductor device 28 and the planar shape of the substrate through-hole 13c coincide with each other.

Seventh Embodiment

Figure 11:
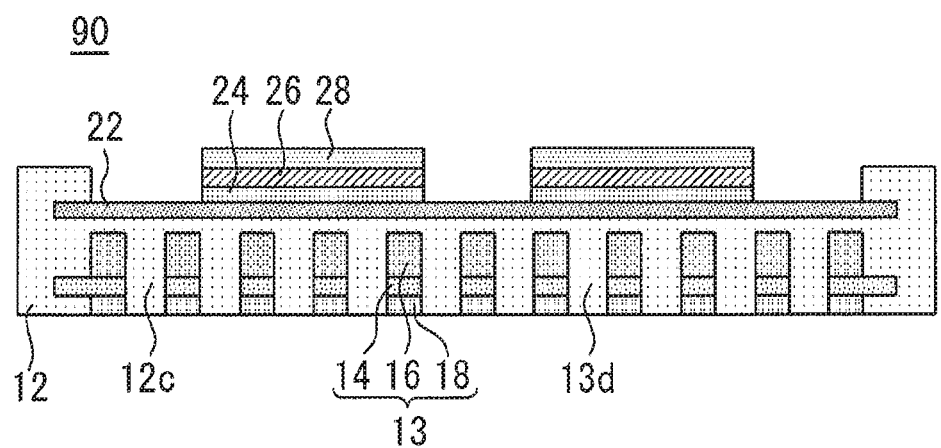
FIG. 11 is a cross-sectional view of a semiconductor apparatus according to a seventh embodiment.
Figure 12:
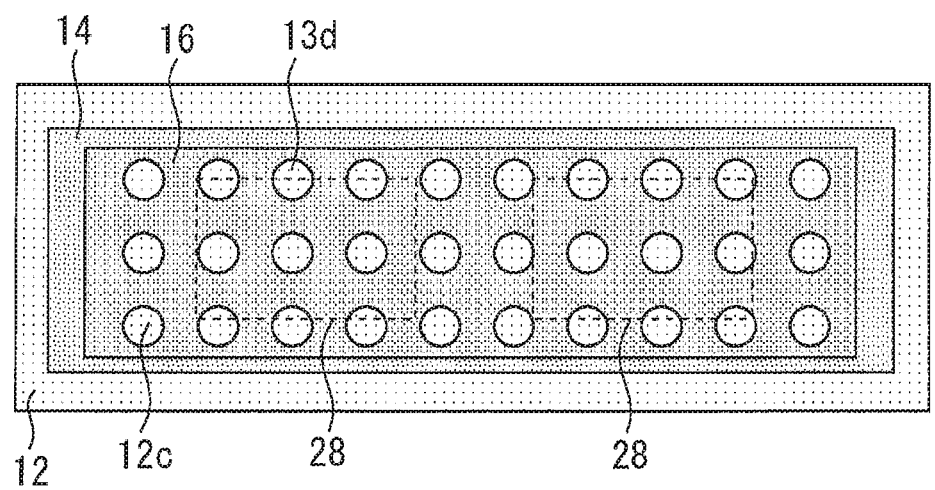
FIG. 12 is a plan view of the substrate and the like of the semiconductor apparatus of FIG. 11.

FIG. 11 is a cross-sectional view of a semiconductor apparatus 90 according to a seventh embodiment. Plural substrate through-holes 13d are formed in the substrate 13. The diameter of the substrate through-hole 13d is smaller than the width of the semiconductor device 28. Plural substrate through-holes 13d are provided immediately under the semiconductor device 28. The plural substrate through-holes 13d are filled with a part 12c of the metal base plate 12. FIG. 12 is a plan view of the substrate 13 and the like of the semiconductor apparatus of FIG. 11. Although the substrate through-hole 13d is a round hole, it may be a hole having any shape.

According to the semiconductor apparatus 90 of the seventh embodiment, since the heat dissipation path extending from the semiconductor device 28 has a portion where the embedded ceramic substrate 14 having the thermal conductivity lower than that of the metal base plate 12 does not exist, the heat dissipation is improved. In the sixth embodiment, the size of the substrate through-hole 13c varies depending on the size of the semiconductor device 28. However, the substrate through-hole 13d of the seventh embodiment is irrelevant to the size of the semiconductor device 28. Therefore, the substrate 13 can be used as a component common to plural types, so that reduction of the cost can be expected.

Eighth Embodiment

Figure 13:
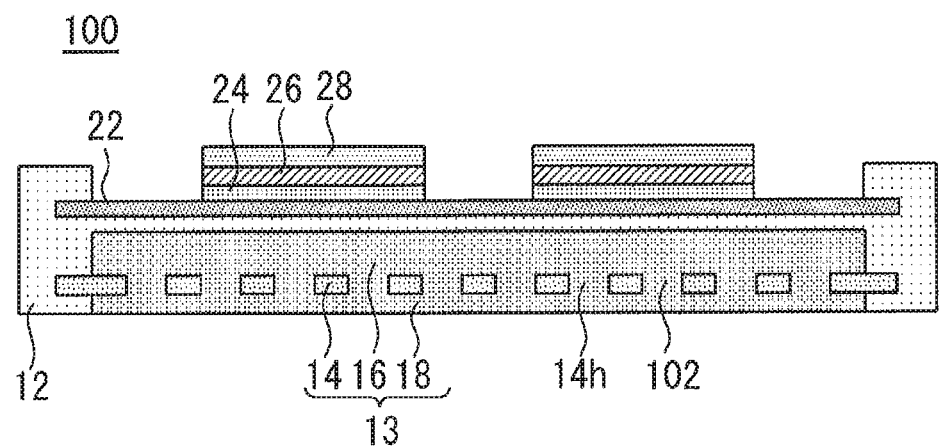
FIG. 13 is cross-sectional view of a semiconductor apparatus according to an eighth embodiment.

FIG. 13 is a cross-sectional view of a semiconductor apparatus 100 according to an eighth embodiment. Plural ceramic substrate through-holes 14h are formed in the embedded ceramic substrate 14. The diameter of the ceramic substrate through-hole 14h is smaller than the width of the semiconductor device 28. Plural ceramic substrate through-holes 14h are provided immediately under the semiconductor device 28. The plural ceramic substrate through-holes 14h are filled with a connection metal 102 for connecting the upper surface metal pattern 16 and the lower surface metal pattern 18.

Figure 14:
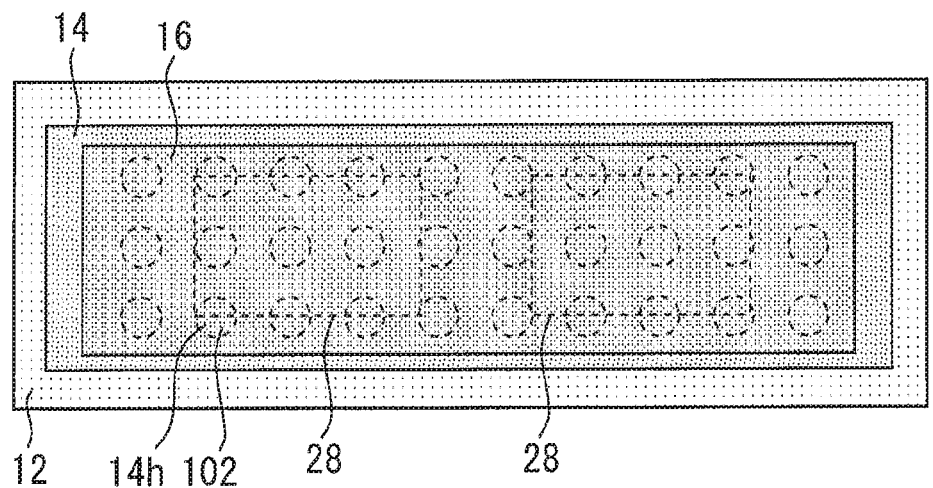

It is preferable that the upper surface metal pattern 16, the lower surface metal pattern 18, and the connection metal 102 are formed of the same material. When the upper surface metal pattern 16, the lower surface metal pattern 18, and the connection metal 102 are formed of the same material, it means that all of the upper surface metal pattern 16, the lower surface metal pattern 18, and the connection metal 102 are formed of a material having a thermal conductivity higher than that of the metal base plate 12. When the connection metal 102 is formed of a material different from the material of the upper surface metal pattern 16 and the lower surface metal pattern 18, the connection metal 102 is formed of a material having a higher thermal conductivity than at least the embedded ceramic substrate 14. FIG. 14 is a plan view of the connection metal 102 and the like of the semiconductor apparatus 100 of FIG. 13. The ceramic substrate through-hole 14h is a round hole, but it may be a hole having any shape.

When the embedded ceramic substrate 14 is one large plate, heat dissipation of the semiconductor device 28 is hindered by the embedded ceramic substrate 14. Therefore, in the eighth embodiment, the ceramic substrate through-holes 14h are provided in the embedded ceramic substrate 14, and the connection metal 102 is provided in the ceramic substrate through-holes 14h. As a result, the heat of the semiconductor device 28 can be promptly discharged to an outside via the upper surface metal pattern 16, the connection metal 102, and the lower surface metal pattern 18. Particularly, by concentrating the ceramic substrate through-holes 14h in the area sandwiched by the two lines L2 in FIG. 7, it is possible to further improve the heat dissipation. For example, the ceramic substrate through-holes 14h may be provided only in the area sandwiched by the two lines L2 in FIG. 7.

Note that the above described effect may be enhanced by combining the features of the semiconductor apparatuses according to the respective embodiments described above.

DESCRIPTION OF SYMBOLS 10 semiconductor apparatus, 12 metal base plate, 13 substrate, 14 embedded ceramic substrate, 16 upper surface metal pattern, 18 lower surface metal pattern, 22 upper surface ceramic substrate

The invention claimed is:
1. A semiconductor apparatus comprising:
a metal base plate;
an upper surface ceramic substrate provided on an upper surface of the metal base plate;
a semiconductor device provided on the upper surface ceramic substrate; and
a substrate that is provided in the metal base plate and includes
an embedded ceramic substrate,
an upper surface metal pattern provided on an upper surface of the embedded ceramic substrate, and
a lower surface metal pattern provided on a lower surface of the embedded ceramic substrate, wherein
a thermal conductivity of the upper surface metal pattern and a thermal conductivity of the lower surface metal pattern are larger than a thermal conductivity of the metal base plate.
2. The semiconductor apparatus according to claim 1, wherein
an end portion of the embedded ceramic substrate is covered by the metal base plate.
3. The semiconductor apparatus according to claim 1, wherein a lower surface of the lower surface metal pattern is exposed to an outside.

4. The semiconductor apparatus according to claim 1, wherein
the substrate is embedded in the metal base plate, and a lower surface of the metal base plate is exposed to an outside.

5. The semiconductor apparatus according to claim 4, wherein
a pin fin is provided on the lower surface of the metal base plate.

6. The semiconductor apparatus according to claim 1, wherein
the upper surface metal pattern and the lower surface metal pattern are different in thickness from each other.

7. The semiconductor apparatus according to claim 6, wherein
the upper surface metal pattern is thicker than the lower surface metal pattern.

8. The semiconductor apparatus according to claim 1, wherein
the semiconductor apparatus comprises a plurality of the substrates provided next to one another in a direction parallel to the upper surface of the metal base plate.

9. The semiconductor apparatus according to claim 8, wherein
the semiconductor apparatus comprises a plurality of the semiconductor devices, and the substrates are provided immediately under the semiconductor device.

10. The semiconductor device according to claim 1, further comprising
a metal film provided on the upper surface ceramic substrate, wherein the semiconductor device is fixed to the metal film, and an intersection angle between a vertical line passing through an outer edge of a lower surface of the metal film and a line connecting the outer edge of the lower surface of the metal film and an outer edge of an upper surface of the upper surface metal pattern is equal to 45° or more.

11. The semiconductor apparatus according to claim 10, wherein
the semiconductor apparatus comprises a plurality of the semiconductor devices, and the upper surface metal pattern is formed in a form of a plurality of island-like patterns.

12. The semiconductor apparatus according to claim 1, wherein
the substrate has a substrate through-hole immediately under the semiconductor device, and the substrate through-hole is filled with the metal base plate.

13. The semiconductor apparatus according to claim 12, further comprising
a metal film provided on the upper surface ceramic substrate, wherein the semiconductor device is fixed to the metal film, and an intersection angle between a vertical line passing through an outer edge of a lower surface of the metal film and a line connecting the outer edge of the lower surface of the metal film and an outer edge of an upper surface of the substrate through-hole is equal to 45° or more.

14. The semiconductor apparatus according to claim 1, wherein
a plurality of substrate through-holes each having a width smaller than a width of the semiconductor device are formed in the substrate, and the plurality of substrate through-holes are filled with the metal base plate.

15. The semiconductor apparatus according to claim 1, wherein
a plurality of ceramic substrate through-holes are formed in the embedded ceramic substrate, and the plurality of ceramic substrate through-holes are filled with a connection metal for connecting the upper surface metal pattern and the lower surface metal pattern.

16. The semiconductor apparatus according to claim 15, wherein
the upper surface metal pattern, the lower surface metal pattern, and the connection metal are formed of a same material.

17. The semiconductor apparatus according to claim 1, wherein
the embedded ceramic substrate is formed of AlN or $Si_3N_4$.

18. The semiconductor apparatus according to claim 1, wherein
the metal base plate physically contacts and surrounds side surfaces of the substrate.

19. The semiconductor apparatus according to claim 1, wherein
the metal base plate physically contacts and surrounds side surfaces of the upper surface ceramic substrate,
a portion of the metal base plate covers a portion of an upper surface of the upper surface ceramic substrate, and
the metal base plate physically contacts and surrounds side surfaces of the substrate.

20. A semiconductor apparatus comprising:
a metal base plate having a recess in an upper surface of the metal base plate;
an upper surface ceramic substrate on an upper surface of the metal base plate in the recess;
a semiconductor device on the upper surface ceramic substrate; and
a substrate in the metal base plate and including
an embedded ceramic substrate,
an upper surface metal pattern on an upper surface of the embedded ceramic substrate, and
a lower surface metal pattern on a lower surface of the embedded ceramic substrate, wherein
a thermal conductivity of the upper surface metal pattern and a thermal conductivity of the lower surface metal pattern are larger than a thermal conductivity of the metal base plate, and
a portion of the metal base plate covers a portion of an upper surface of the upper surface ceramic substrate.

\* \* \* \* \*